(12) United States Patent
Harris et al.

(10) Patent No.: US 7,336,490 B2
(45) Date of Patent: Feb. 26, 2008

(54) MULTI-CHIP MODULE WITH POWER SYSTEM

(75) Inventors: Shaun L. Harris, Mckinney, TX (US); Steven A. Belson, Plano, TX (US); Eric C. Peterson, McKinney, TX (US); Gary W. Williams, Rowlett, TX (US); Christian L. Belady, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 363 days.

(21) Appl. No.: 10/996,721

(22) Filed: Nov. 24, 2004

(65) Prior Publication Data

US 2006/0109629 A1    May 25, 2006

(51) Int. Cl.
*H05K 7/20* (2006.01)
*F28F 7/00* (2006.01)
*F28D 15/00* (2006.01)

(52) U.S. Cl. .............. 361/704; 165/80.2; 165/80.3; 165/185; 165/121; 361/694; 361/695; 361/700; 361/721

(58) Field of Classification Search .............. 361/721
See application file for complete search history.

(56) References Cited

U.S. PATENT DOCUMENTS

| 4,916,575 | A  | * | 4/1990  | Van Asten ......... 361/715 |
| 6,151,215 | A  | * | 11/2000 | Hoffman ........... 361/704 |
| 6,819,562 | B2 | * | 11/2004 | Boudreaux et al. ..... 361/690 |
| 2004/0218367 | A1 | * | 11/2004 | Lin et al. ............ 361/721 |

* cited by examiner

*Primary Examiner*—Gregory D Thompson

(57) ABSTRACT

Embodiments include apparatus, methods, and systems having a multi-chip module with a power system. An exemplary electronic module includes a printed circuit board (PCB) having a memory and plural processors. A power system couples to and is disposed vertically above the PCB. A thermal dissipation device is disposed between the power system and the PCB for dissipating heat, via a direct heat exchange, from both the power system and the plural processors.

11 Claims, 6 Drawing Sheets

MULTI-CHIP MODULE WITH POWER SYSTEM

BACKGROUND

Some electronic systems utilize several printed circuit boards with many different electronic components interconnected to the circuit boards. As these electronic systems decrease in size and increase in performance, packing density, heat dissipation, and power distribution architecture become increasingly important.

As noted, packing density is one important criterion in many electronic systems. One way to reduce the actual size of an electronic device is to more closely position the electrical components together. Electrical components within a circuit board, however, are generally already tightly confined, and additional space may not be readily available. If, however, electrical components can be positioned to reduce the overall size of the electronic device, then significant savings and advantages can be realized.

Heat dissipation is also an important criterion in many electronic systems. Circuit boards may include a plurality of heat-generating devices that must be cooled in order to operate within a specified operating temperature. If these heat-generating devices are not sufficiently cooled, then the devices can exhibit a decrease in performance or even permanently fail.

As processor and memory technologies advance, power distribution architecture concurrently must evolve to meet demands of processors and memories. Designers consider many factors when developing power distribution architectures for electronic systems. For instance, important considerations include positioning power in close proximity to processor circuit boards, providing reliable power to the processor circuit boards, and dissipating heat from the power converter and/or power supplies.

The design and layout of printed circuit board components can be quite complex and challenging. Designers must consider many important factors, such as packing density, heat dissipation, and power distribution architecture. Improvements in these areas can realize important benefits for electronic systems and devices.

SUMMARY

Embodiments in accordance with the present invention include apparatus, methods, and systems having a multi-chip module with a power system. An exemplary electronic module includes a printed circuit board (PCB) having a memory and plural processors. A power system couples to and is disposed vertically above the PCB. A thermal dissipation device is disposed between the power system and the PCB for dissipating heat, via a direct heat exchange, from both the power system and the plural processors.

In another exemplary embodiment, a method comprises connecting a memory and plural separate processors to a circuit board; connecting, to form a vertically stacked configuration, a power system board to the circuit board; providing a thermal dissipation device between the power system board and the circuit board; dissipating heat from a surface area of the power system board with a first surface of the thermal dissipation device; and dissipating heat from a surface area of the plural processors with a second surface of the thermal dissipation device.

Other embodiments and variations of these embodiments are shown and taught in the accompanying drawings and detailed description.

DETAILED DESCRIPTION

Figure 1:
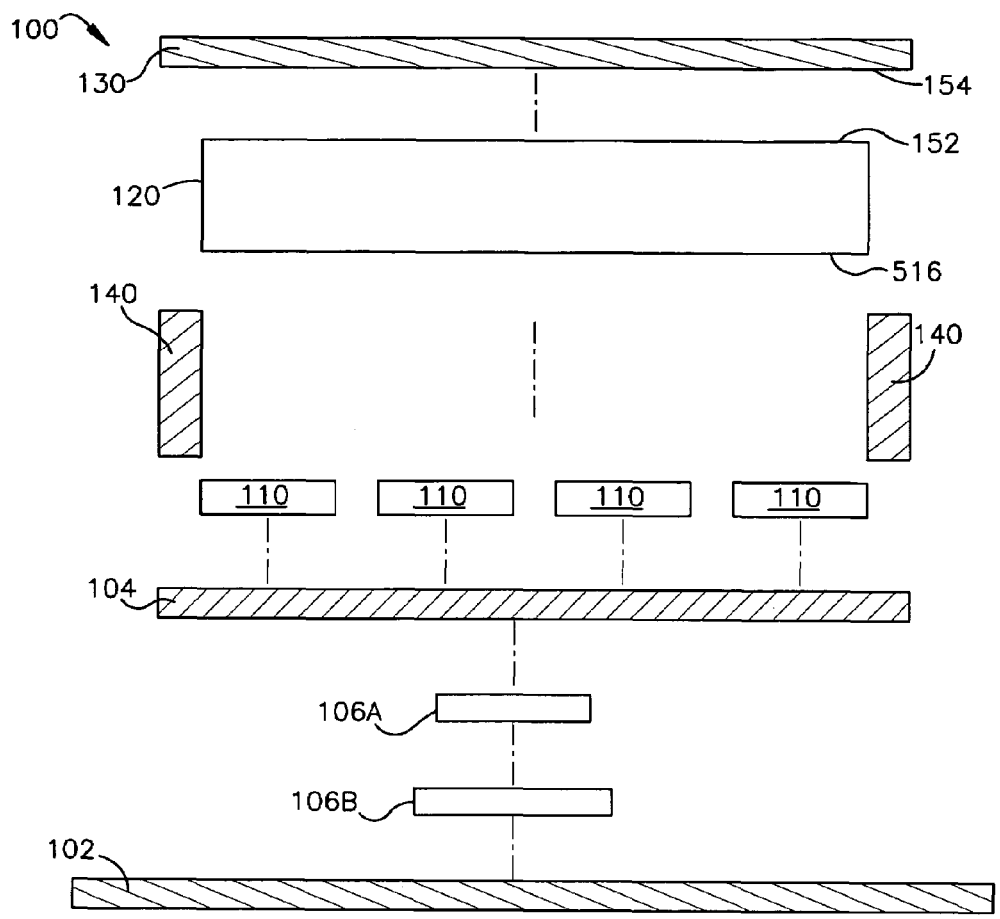
FIG. 1 is an exploded side view of a block diagram of an electronic assembly in accordance with an exemplary embodiment of the present invention.

FIGS. 1-6 show an electronic system or assembly 100 in accordance with an exemplary embodiment of the present invention. The electronic assembly 100 includes two printed circuit boards (PCB) or printed wiring boards (PWB) 102 and 104. The PCBs 102 and 104 can have a variety of configurations and still be within embodiments in accordance with the invention. By way of example, the PCBs can include power module circuit boards, voltage regulation module (VRM) circuit boards, controller boards (such as a special type of expansion board that contains a controller for a peripheral device), expansion boards (such as any board that plugs into an expansion slot of a computer), or modules. As another example, the PCB 102 can be a motherboard, and the PCB 104 can be a daughterboard.

A motherboard is a printed circuit board that can be used in a personal computer, server, or other electronic device. The motherboard (also known as a main board or system board) can provide attachment points for processors, graphics cards, sound cards, controllers, memory, ICs, modules, PCBs, and many other electronic components and devices in a computing system. The daughterboard can be utilized as an extension of the motherboard or other card or board. The daughterboard can have plugs, sockets, pins, connectors, or other attachments for the motherboard or other boards. Connectors 106A and 106B, for example, can be used to electrically couple the PCB 102 to the PCB 104. Connectors 106 provide a mechanical and electrical interface or connection between the PCBs and may include, for example, a removably connectable plug (male) and socket (female). Alternatively, a single connector can be used to connect the PCBs 102 and 104. Further, a connection mechanism between PCBs 102 and 104 can be located at various positions, such as, but not limited to, the sides and/or ends of the PCBs.

The PCBs 102 and 104 include a plurality of electronic components or devices. For example, the PCB 104 includes a plurality of heat-generating components or devices 110. These heat-generating devices include any electronic component that generates heat during operation. For example, heat-generating devices include, but are not limited to, electronic power circuits, integrated circuits (ICs) or chips, digital memory chips, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range. An ASIC can comprise an integrated circuit or chip that has functionality customized for a particular purpose or application. The PCBs 102 and 104 can also include a plurality of electronic components or device that may or may not generate heat, that may generate low or insignificant amounts of heat, or that may generate heat but not require the generated heat to be thermally dissipated from the device for the device to operate properly or within a specified temperature range. Examples of such devices include, but are not limited to, resistors, capacitors, transistors, diodes, memories, etc.

The electronic assembly 100 includes at least one thermal solution or thermal dissipation device 120. Thermal dissipation devices include, but are not limited to, heat spreaders, cold plates or thermal-stiffener plates, refrigeration (evaporative cooling) plates, heat pipes, mechanical gap fillers (such as a plurality of rods, pins, etc.), thermal pads, or other devices adapted to dissipate heat. Further, thermal dissipation devices include thermal compounds and thermal interface material that can be used to form a thermally conductive layer on a substrate, between electronic components, or within a finished component. For example, thermally conductive resins, tapes, molded thermoplastic compounds, adhesives and greases can be used between a heat-generating device and thermal dissipating device to improve heat dissipation and/or heat transfer.

Further, thermal dissipation devices include heatsinks. A heatsink is a component designed to reduce the temperature of a heat-generating device or component, such as heat-generating components 110. A heatsink, for example, can dissipate heat in a direct or indirect heat exchange with the electronic components, the heat being dissipated into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. Further, the thermal dissipation device, including heatsinks, can use liquids or phase change material.

Figure 5:
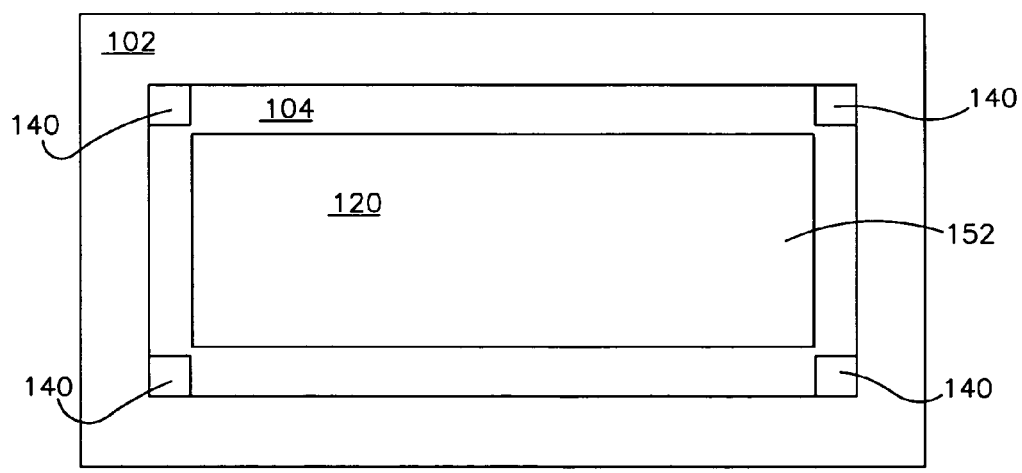
FIG. 5 is a top view of the FIG. 2 with the power system removed from the electronic assembly.
Figure 6:
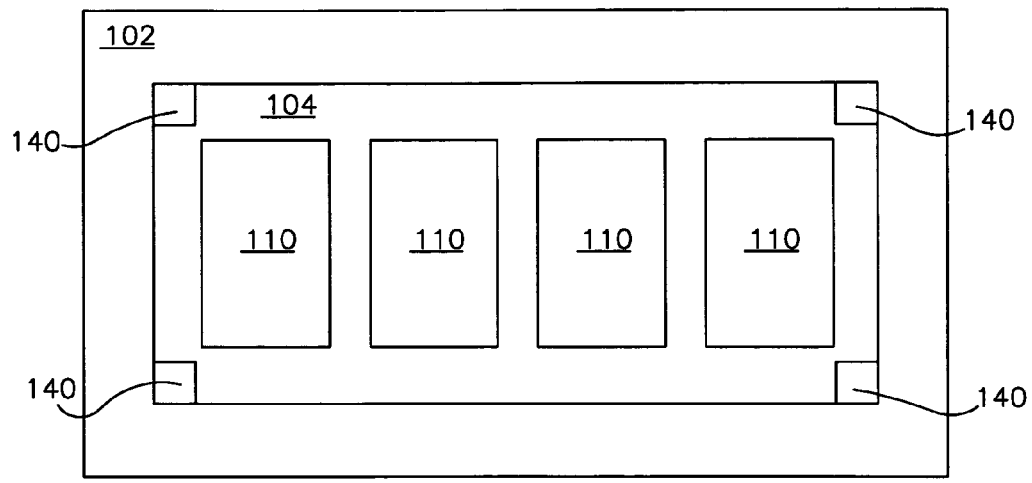
FIG. 6 is a top view of FIG. 2 with the power system and thermal dissipation device removed from the electronic assembly.

The electronic assembly 100 also includes at least one power supply or power system 130. Electrical connectors or power coupling devices 140 connect the respective power system 130 to the PCB 104. FIGS. 5 and 6 show four connectors 140 located in respective corners of the PCB 104 and/or power system 130. Although four connectors 140 are shown, embodiments in accordance with the invention are not limited to a particular number or location of connectors. For example, a single connector can be used to couple the power system 130 to the PCB 104. Alternatively, the connectors can be located at various positions, such as, but not limited to, the sides and/or ends of the PCB 104 and/or power system 130.

The power system 130 can include numerous embodiments for providing power to electronic components (such as heat-generating components 110) and/or PCBs (such as the PCB 104) within the electronic assembly 100. For example, the power system can be a factorized power architecture (FPA) module, a power converter, such as a direct current (DC) converter or DC-DC converter, DC linear regulator, AC-DC converter, DC switching regulator, or DC charge pump.

Figure 2:
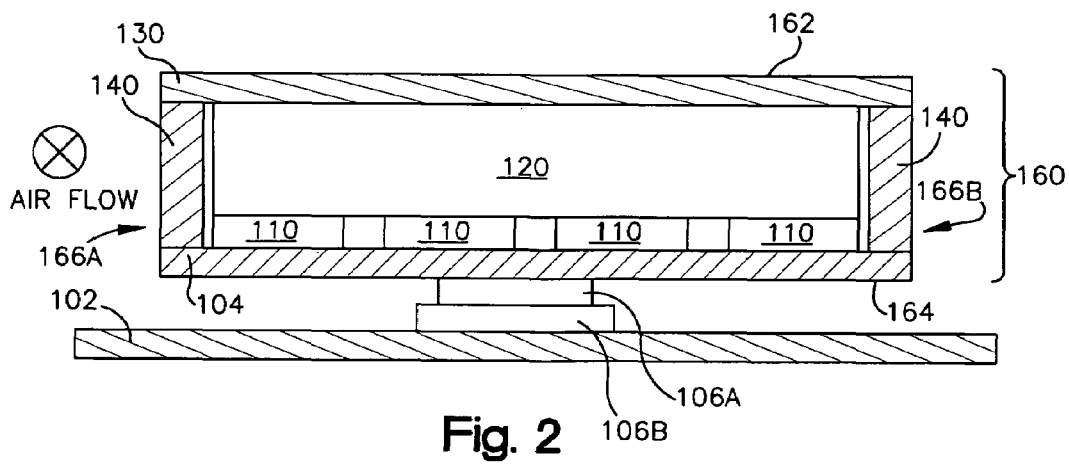
FIG. 2 is a side view of the electronic assembly of FIG. 1 with the electronic assembly being assembled together.

The power system 130 can be configured as PCBs, power module assemblies, power circuit cards/boards, and/or power module PCBs. As best shown in FIG. 2, the power system 130 is disposed in a parallel and vertically stacked-up relationship with the thermal dissipation device 120 and PCBs 102 and 104.

The power system 130 may be modular and replaceable. In some embodiments, the power system 130 is an independently-operable unit or module that can be constructed with standardized units or dimensions for flexibility and replaceability for use in the electronic assembly 100. Further, the power system 130 can be connected to or removed from the electronic assembly (example, the PCB 104) without connecting, removing, or replacing other components in the electronic assembly 100 (example, the heat-generating components 110). By way of illustration, suppose for example that power system 130 fails or otherwise needs replaced or upgraded. The power system 130 can be disconnected and removed from the PCB 104 without removing or replacing the thermal dissipation device 120, the heat-generating components 110, and/or the PCBs 102 and 104.

Once connected, the PCB 102 is generally parallel to the PCB 104. The PCBs 102 and 104 are mechanically and electrically connected to form a vertical stacked-up configuration. In particular, the connectors 106A and 106B couple the PCBs together.

Figure 3:
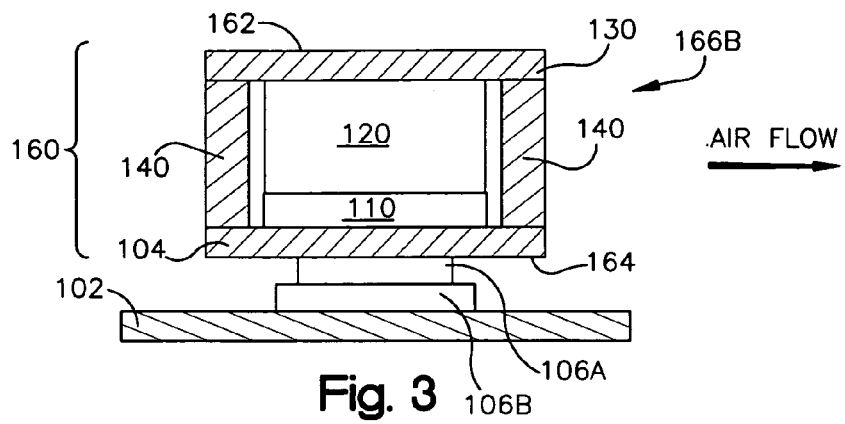
FIG. 3 is an end view of FIG. 2.
Figure 4:
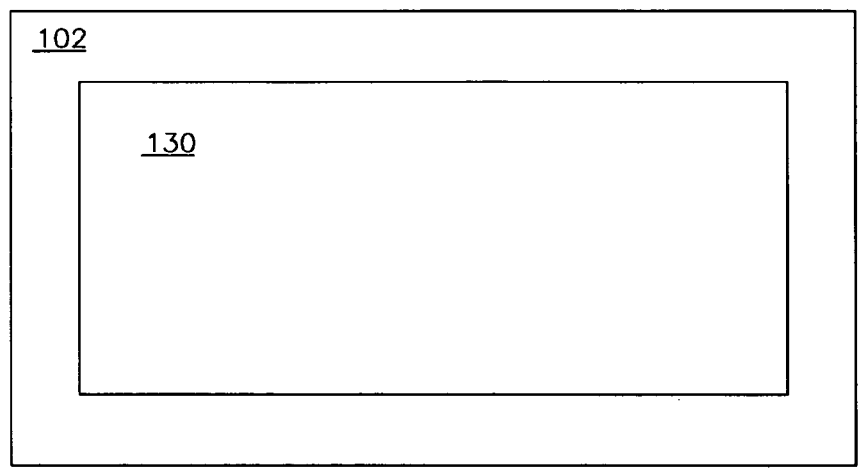
FIG. 4 is a top view of FIG. 2.

As best shown in FIGS. 2 and 3, the electronic assembly 100 comprises three different vertically stacked layers. A first layer includes the PCB 102; a second layer includes the PCB 104; and a third layer includes the power system 130. Thermal dissipation device 120 is disposed or sandwiched between the second and third layers such that a distance between the second and third layer is approximately equal to a thickness of the thermal dissipation device. In one exemplary embodiment, the thermal dissipation device 120 substantially fills a volume of space that is created between the power system 130 and heat-generating components 110 of PCB 104. As shown for example in FIGS. 1-6, a top side 152 of the thermal dissipation device 120 extends along all of or substantially all of the surface area (length×width) of an underside 154 of the power system 130. Likewise, a bottom side 156 of the thermal dissipation device 120 extends along all of or substantially all of the surface area (length×width) of the top sides of the heat-generating components 110 and/or PCB 104.

The thermal dissipation device 120 can directly or indirectly attach or contact various layers and/or electrical components (such as the power system 130, the heat-generating components 110, and/or PCB 104). For example, the thermal dissipation device 120 can directly contact the power system 130 so as to directly transfer or dissipate heat away from the power system. Further, the thermal dissipation device 120 can directly contact the heat-generating components 110 so as to directly transfer or dissipate heat away from the heat-generating components.

The thermal dissipation device 120A can utilize a remote heat exchanger (RHE). An RHE enables the thermal dissipation device to be remote from the heat-generating device (such as PCB 104, heat-generating components 110, and/or power system 130). For example, heat can be transferred from the heat-generating device to an attachment block having a heat pipe. The heat pipe, for instance, can be a hollow copper pipe containing a fluid and wicking material. Through a process of vaporization and re-condensation, heat travels through the heat pipe to a heat exchanger, such as a finned heat sink. Localized airflow can be used to evacuate the heat to the environment.

As shown in FIG. 1, thermal dissipation device 120 comprises a unitary or single member. Embodiments in accordance with the invention, though, can utilize a wide variety of types and number of thermal dissipation devices. For example, the thermal dissipation device 120 can comprise a plurality of individual, separate members.

The thermal dissipation device 120 can be an active device that produces an airflow. For purposes of illustration only, the electronic assembly 100 is shown with an airflow direction as indicated with arrows in FIGS. 2 and 3 (the airflow being into the page and indicated with a circle and "X" in FIG. 2). The airflow can be provided, for example, with a fan or other device positioned within the electronic assembly 100 or within or proximate the thermal dissipation device 120. The airflow is directed in a pathway that is parallel to the PCBs 102 and 104 and power systems 130. A primary airflow can thus be directed at, above, or below the PCB 104, the heat-generating components 110, the power system 130, and/or the thermal dissipation device 120. Further, the primary airflow can be simultaneously directed to several different components/layers (such as the PCB 104, the heat-generating components 110, the power system 130, and/or the thermal dissipation device 120) or exclusively at individual components/layers. Thus, the same airflow can be used to cool or dissipate heat simultaneously from multiple layers and/or components or solely from a single layer and/or component. Further, the airflow can be utilized to assist or augment heat dissipation. For example, the thermal dissipation device can directly contact one or both of the power system 130 and/or heat-generating components 110 and effect direct dissipating heat exchange. The airflow can simultaneously be directed to one or both of the power system 130 and/or heat-generating components 110 to further cool these devices and assist in heat dissipation.

As shown in FIGS. 2-6, a single thermal dissipation device 120 can be used to dissipate heat from several different heat-generating devices 110. For example, thermal dissipation device 120 is sandwiched between power systems 130 and PCB 104. In this configuration, the same thermal dissipation device 120 simultaneously dissipates heat away from both the power system 130 and the heat-generating devices 110.

Figure 7:
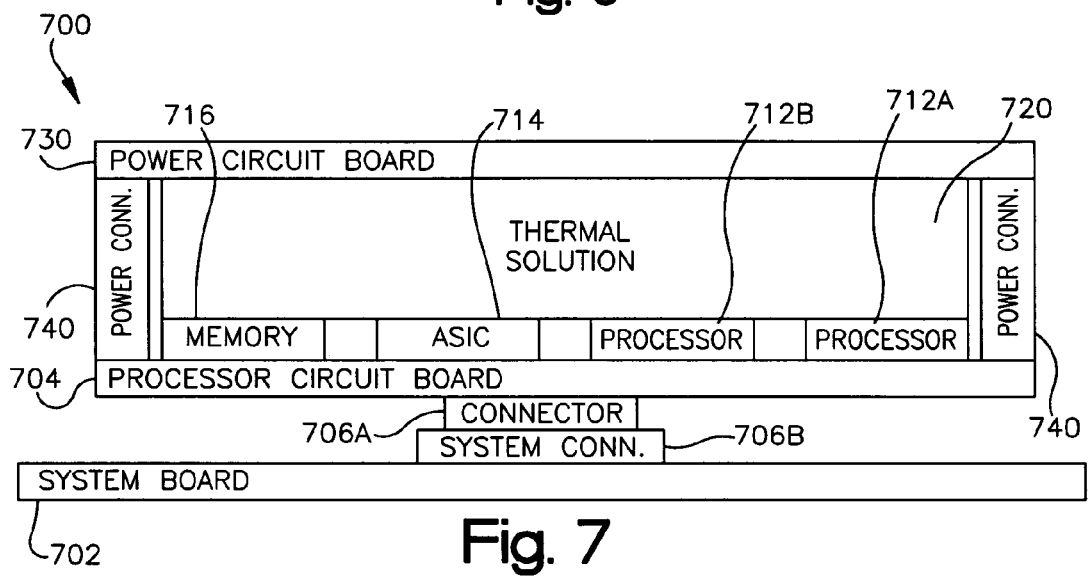
FIG. 7 is a side view of an exemplary embodiment of an electronic assembly.
Figure 8:
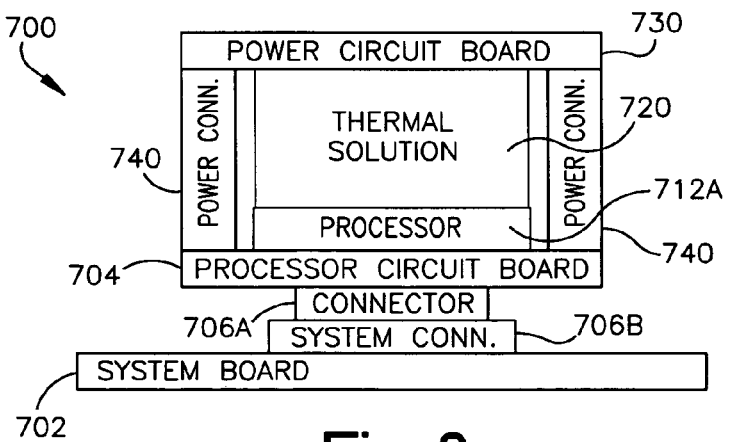
FIG. 8 is an end view of FIG. 7.

Various different electronic components, layers, and PCBs can be combined into different embodiments in accordance with the invention. FIGS. 7 and 8 illustrate one such exemplary embodiment as electronic assembly 700. In this figure, a system board 702 connects to a processor circuit board 704 with a processor connector 706A and a system connector 706B. The processor circuit board 704 can include (among other electrical components) processors, memories, and ASICs. For example, the processor circuit board 704 can have numerous electronic heat-generating components, such as two processors 712A and 712B, an ASIC 714, and memory 716, to name a few examples. A thermal solution 720 is positioned directly above the processor circuit board 704 to cool and dissipate heat, via direct heat exchange, from the processors 712A, 712B, ASIC 714, and memory 716. A power circuit board 730 is above the thermal solution 720. The thermal solution 720 can cool and dissipate heat, via direct heat exchange, for the power circuit board 730. Electrical connectors 740 couple or connect the power circuit board 730 to the processor circuit board 704. The power circuit board 730 can include power controls that can, for example, provide power control functionality for the power circuit board.

Embodiments in accordance with the present invention can utilize a modular connective architecture. If a particular electronic component (including PCBs) or device fails or otherwise needs to be replaced, the electronic component can be removed from the module or the electronic assembly and replaced with a new and/or different component. As such, the electronic assemblies can be constructed with standardized electronic components and/or dimensions to enable flexibility and variety of use and exchange of components. Looking to FIG. 7 as an example, if the power circuit board 730 fails or needs to be replaced, the power circuit board 730 can be disconnected or uncoupled from the power connectors 740 and removed from the electronic assembly 700 while the processor circuit board 704 and system board 702 remain mechanically connected. A new and/or different power circuit board can thereafter be connected to the connectors 740 and utilized with the electronic assembly 700. As such, expensive heat-generating components 110 (such as processors, memories, ASICs, etc.) can remain unchanged and do not need to be removed or replaced.

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

The configuration or arrangement of electronic components, layers, and/or modules shown in the figures saves weight, space, and costs since the components and/or layers are efficiently spaced and additional thermal dissipation devices are not required. For example, embodiments in accordance with the present invention can utilize a variety of modules. Looking to FIGS. 2 and 3, the PCB 104 can be a processor module that includes heat-generating components 110 (such as two separate processors, an ASIC, and memory all on the same board or card). As another example, the power system 130 can form a power system module. The power system module can vertically stack and connect or coupled, via connectors 140, to the PCB 104. The thermal dissipation device 120 can be disposed or sandwiched between the power system module and processor module. Together, the power system module, connectors, processor module, and thermal dissipation device form a power/processor module that can be removably connected to, for example, the PCB 102. FIGS. 2 and 3, for example, show such a processor/power 160 module connected, via connectors 106A and 106B, to PCB 102.

The processor/power module 160 has a general rectangular configuration. A top surface 162 is formed from the top surface of the power system 130, and a bottom surface 164 is formed from the bottom surface of the PCB 104. The connectors 140 can form ends 166A, 166B, respectively. Embodiments in accordance with the present invention may utilize processor/power modules with various shapes and sizes and various number of processors. By way of example only, the processor/power module 160 with two processors can be configured to have overall dimensions of 194 mm length (X-axis) by 71 mm width (Y-axis) by 22 mm height (Z-axis).

In order to facilitate modularity within the electronic assembly, various removable connections between electronic components can be utilized. By way of example, such connections include, but are not limited to, land grid arrays (LGAs), pin grid arrays (PGAs), plugs (example, male), sockets (example, female), pins, connectors, soldering, or other removable or disconnectable attachments.

Embodiments in accordance with the invention are not limited to a single power system 130 vertically stacked on a single PCB 104. For example, more than two power systems can be vertically stacked on the PCB 104. Alternatively, more than one PCB 104 having plural vertically stacked power systems can be mechanically and electrically coupled to a single PCB 102.

Figure 10:
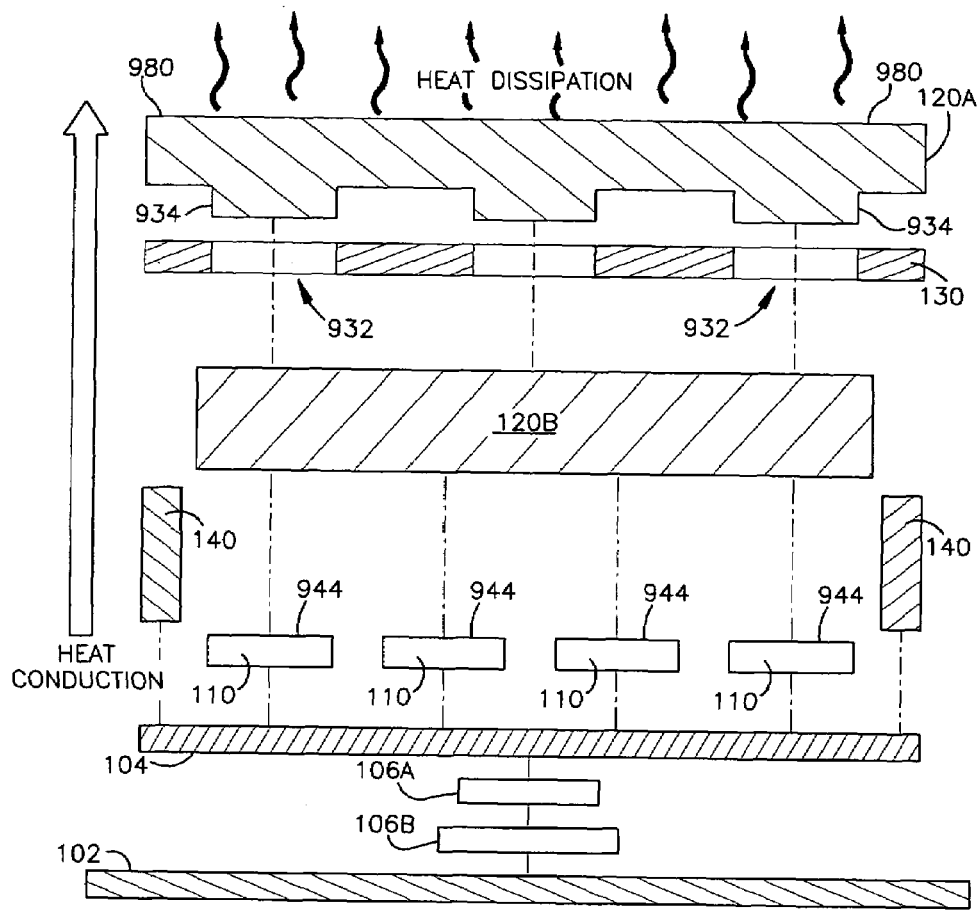
FIG. 10 is an exploded side view of an exemplary embodiment of an electronic assembly.
Figure 11:
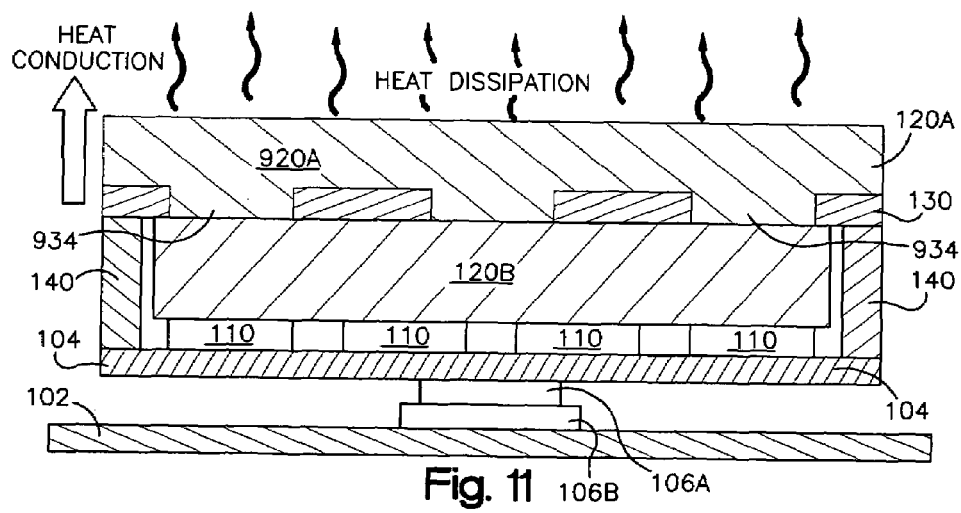
FIG. 11 is a side view of the electronic assembly of FIG. 10 with the electronic assembly being assembled together.

Heat can be conducted or exchanged through plural layers and/or plural modules. This heat can be evacuated or dissipated from a common exit location or common surface area. For example, heat generated by the heat-generating components can be vertically conducted or transferred through the power system and heat dissipation device and thereafter dissipated into the air or environment at a top surface of the electronic assembly. FIGS. 9-11 show an exemplary embodiment for conducting and dissipating heat in accordance with embodiments of the invention.

As shown in FIGS. 9-11, a PCB 102 connects to a PCB 104 via connectors 106A and 106B. The PCB 104 includes a plurality of heat-generating components 110. A first thermal dissipation device 120A is positioned at an outer surface of the electronic assembly or on top of power system 130. A second thermal dissipation device 120B is sandwiched or positioned between PCB 104 and power system 130.

Figure 9B:
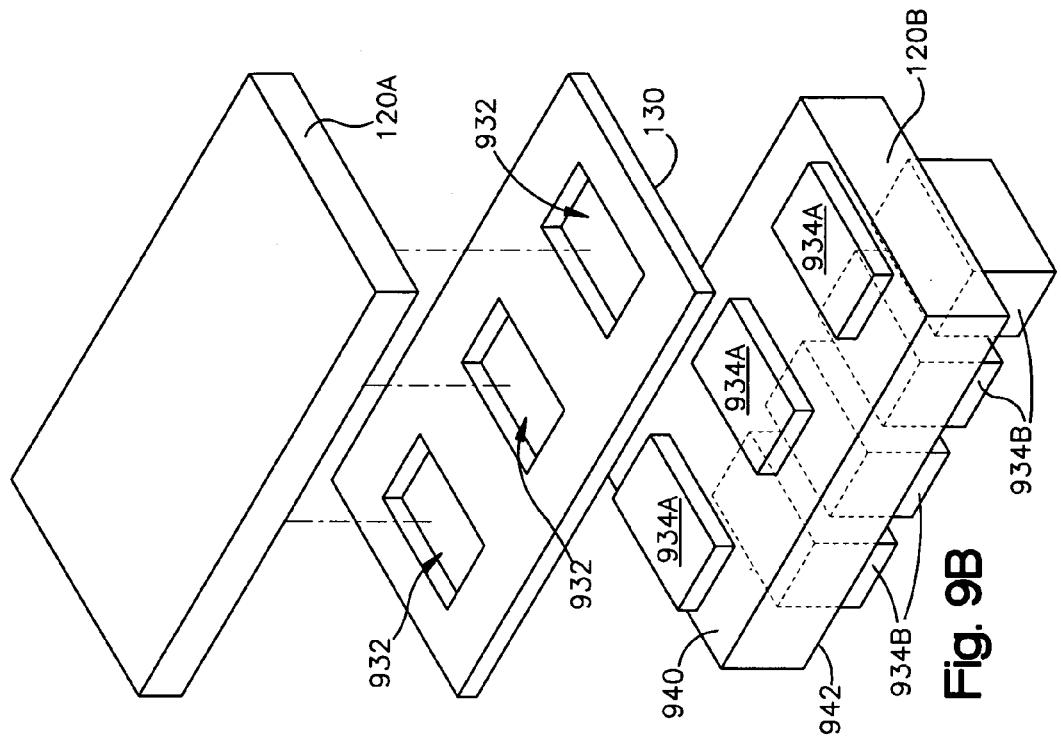
FIG. 9B is an exploded perspective view of another embodiment of a power system between two thermal dissipation devices.
Figure 9A:
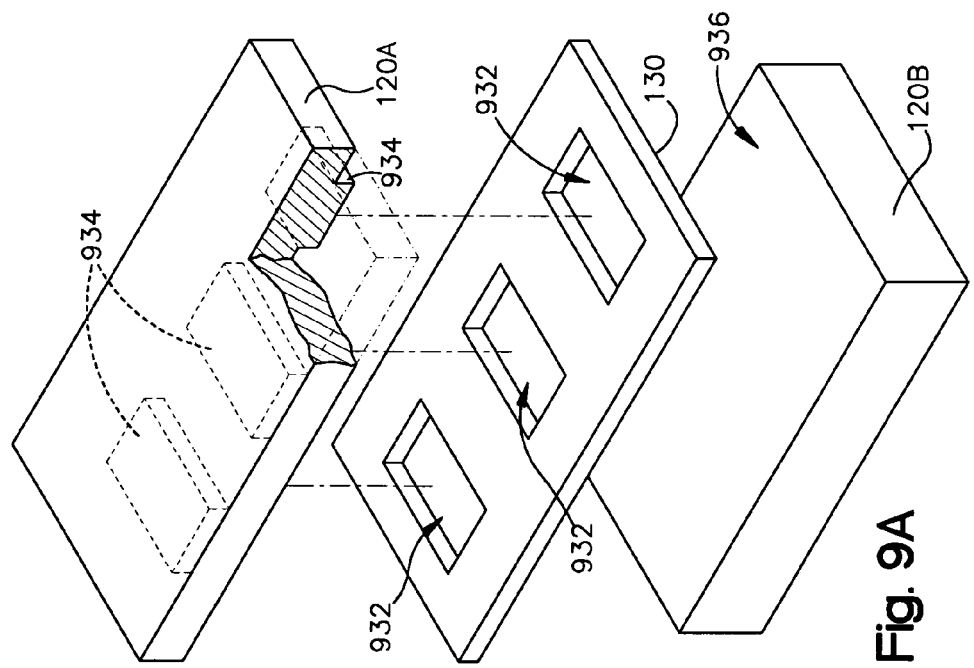
FIG. 9A is an exploded perspective view of a power system between two thermal dissipation devices.

FIGS. 9A and 9B show exemplary embodiments for the power system and thermal dissipation device. The power system 130 includes at least one opening or hole 932. Each hole 932 is adapted or shaped to receive a portion of the thermal dissipation device such that the portion extends through the hole.

In FIG. 9A, the thermal dissipation device 120A includes at least one extension or protrusion 934 that extends outwardly from a body of the thermal dissipation device. The extension 934 is adapted and shaped to fit through a corresponding hole 932 and contact a top outer surface 936 of thermal dissipation device 120B.

In FIG. 9B, the thermal dissipation device 120B includes at least one extension or protrusion 934A that extends outwardly from a top surface 940 of a body of the thermal dissipation device and at least one extension or protrusion 934B that extends outwardly from a bottom surface 942 of the body of the thermal dissipation device. The extension 934A is adapted and shaped to fit through a corresponding hole 932 and contact a bottom outer surface 950 of thermal dissipation device 120A. The extension 934B is adapted and shaped to abut or contact a top surface of heat-generating components 110.

By way of illustration, the embodiment shown in FIG. 9A is illustrated in the electronic assembly 100 of FIGS. 10 and 11. Here, thermal dissipation device 120A includes three extensions 934 that extend downwardly from a bottom surface of the thermal dissipation device 120A. The power system 130 has a body with three holes 932. The three extensions 934 extend through the three holes 932 to contact or abut a top surface 936 of thermal dissipation device 120B.

The heat-generating components 110 generate heat. This heat is conducted or transferred from the top surfaces 944, through the thermal dissipation device 120B, through extensions 934, through thermal dissipation device 120A, and dissipated out through a top surface 980 of thermal dissipation device 120A.

Figure 12A:
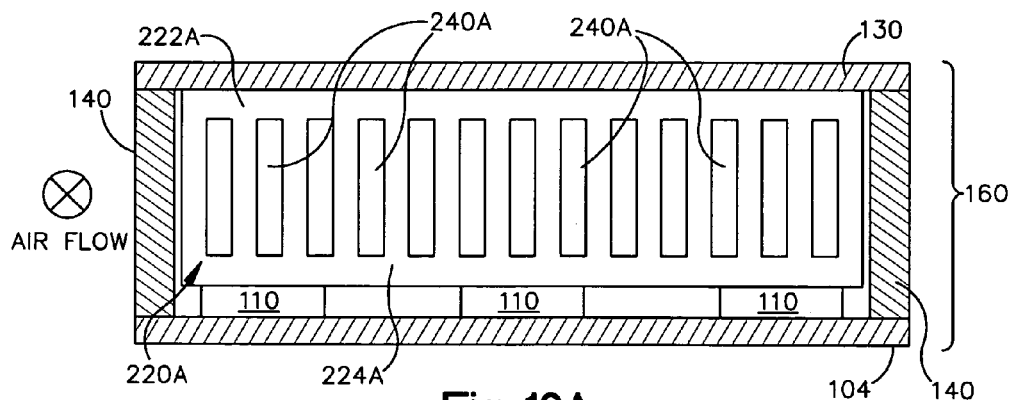
FIG. 12A shows an exemplary embodiment of a processor/power module.
Figure 12B:
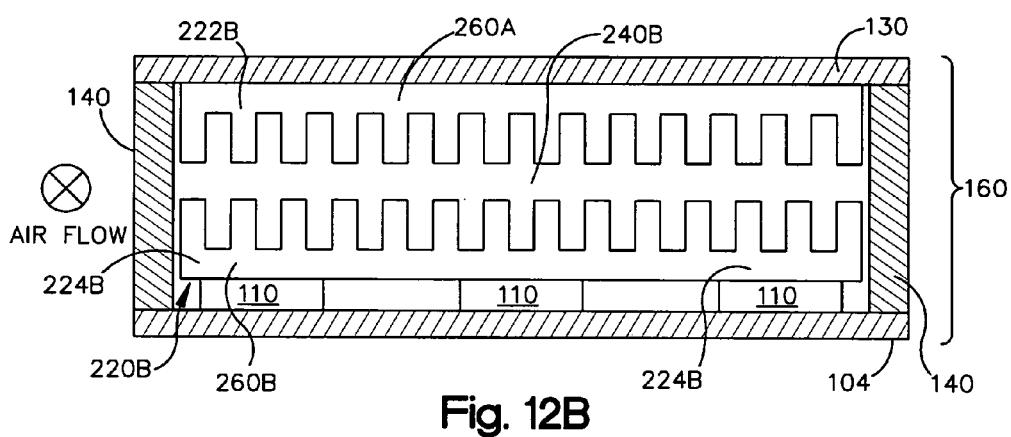
FIG. 12B shows another exemplary embodiment of a processor/power module.
Figure 12C:
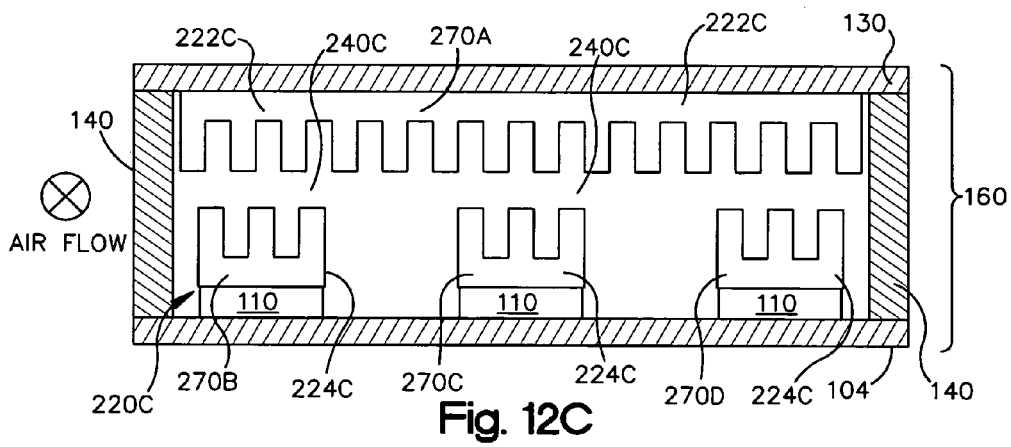
FIG. 12C shows yet another exemplary embodiment of a processor/power module.

FIGS. 12A-12C show other exemplary embodiments in accordance with the invention. These embodiments, for example, can be implemented with processor/power module 160 or other embodiments.

FIG. 12A shows a processor/power module 160 that includes a thermal dissipation device 220A having a plurality of openings 240A. The openings 240A can have a variety of configurations and/or shapes and include slots, holes, etc. Further, the openings 240A can be formed from adjacent pins, rods, fins, etc. The openings 240A enable an airflow (the airflow being into the page and indicated with a circle and "X") to pass through the thermal dissipation device 220A. During operation of the module 160, heat generated from the power system 130 transfers to a base portion 222A of the thermal dissipation device 220A, while heat generated from the heat-generating components 110 transfers to a second base portion 224A of the thermal dissipation device 220A. Heat generated from both the power system 130 and heat-generating components is dissipated as air passes through the openings 240A of the thermal dissipation device 220A.

FIG. 12B shows another example of a power/processor module 160. Here, the thermal dissipation device 220B is formed of two separate components 260A and 260B. During operation of the module 160, heat generated from the power system 130 transfers to a base portion 222B of component 260A, while heat generated from the heat-generating components 110 transfers to a second base portion 224B of component 260B. Heat generated from both the power system 130 and heat-generating components is dissipated as air passes through the openings 240B of the thermal dissipation device 220B.

FIG. 12C shows another example of a power/processor module 160. Here, the thermal dissipation device 220C is formed of a plurality of separate components 270A, 270B, 270C, and 270D. Each component, for example, can dissipate heat for one or more components (such as one or more of heat-generating components 110, PCB 104, and/or power system 130). During operation of the module 160, heat generated from the power system 130 transfers to a base portion 222C of component 270A, while heat generated from the heat-generating components 110 transfers to a second base portion 224C of components 270B, 270C, and 270D. Heat generated from both the power system 130 and heat-generating components is dissipated as air passes through the openings 240C of the thermal dissipation device 220C.

Embodiments in accordance with the invention can be utilized in a wide variety of different methods and embodiments. For example, embodiments in accordance with the present invention can utilize embodiments taught in U.S. patent application Ser. No. 10/800,837 filed Mar. 15, 2004, entitled "Multi-Processor Module" and incorporated herein by reference. As another example, an exemplary method can comprise connecting plural heat-generating components to a first circuit board. The heat-generating components can include plural separate processors (example processors formed on separate dies), ASICs, memories, and other devices. A power system can be connected in a vertical stacked-up configuration to the first circuit board. One or more power connectors can couple the power system to the first circuit board. A thermal dissipation device is disposed or sandwiched between the first circuit board and the power system. The thermal dissipation device thermally dissipates heat away from both the first circuit board and the power system. The thermal dissipation device can simultaneously dissipate heat (for example via a direct heat exchange) from both the first circuit board and the power system. Additionally, the thermal dissipation device can comprise, utilize, or generate a flow of air in an airflow pathway. The airflow pathway can be directed to any one of or any combination of the first circuit board, the power system, the thermal dissipation device, and/or the heat-generating components coupled or attached to a top surface of the first circuit board. Together, the power system, first circuit board, thermal dissipation device, and heat-generating components form a power/processor module. This module can be connected to a second circuit board (such as a system board or motherboard) and arranged, for example, in a vertically stacked-up configuration. The power/processor module can be removed from the second circuit board. Thereafter, the components with in the module (such as the thermal dissipation device, the PCB, the processors, the memory, the ASIC, and/or the power system) can be individually or jointly repaired or replaced. The revised power/processor module can then be re-connected to the second circuit board.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. An electronic module, comprising:
   a printed circuit board (PCB) having a memory and plural processors;
   a power system coupled to and disposed vertically above the PCB;
   a thermal dissipation device disposed between the power system and the PCB for dissipating heat, via a direct heat exchange, from both the power system and the plural processors, wherein the thermal dissipation device has a bottom surface with a surface area that directly contacts a top surface of the processors.

2. The electronic module of claim 1 wherein the thermal dissipation device further dissipates heat, via a direct heat exchange, from the memory.

3. The electronic module of claim 1 wherein the thermal dissipation device directly contacts both the processors and the power system for dissipating heat directly from the processors and power system to the thermal dissipation device.

4. The electronic module of claim 1 wherein the thermal dissipation device has a top surface with a surface area that directly contacts a bottom surface of the power system.

5. The electronic module of claim 4 wherein the surface area of the top surface extends substantially along all of a surface area of the bottom surface of the power system.

6. The electronic module of claim 1 wherein the surface area of the bottom surface extends substantially along all of a surface area of the top surface of the processors.

7. The electronic module of claim 1 comprising two different vertically stacked layers separated from each other, the layers including the PCB as a first layer and the power system as a second layer.

8. The electronic module of claim 1 wherein the thermal dissipation device substantially fills a volume of space formed between a surface area of a top side of the PCB and a surface area of a bottom side of the power system.

9. A method, comprising:
   connecting a memory and plural separate processors to a circuit board;
   connecting, to form a vertically stacked configuration, a power system board to the circuit board;
   providing a thermal dissipation device between the power system board and the circuit board;
   dissipating heat from a surface area of the power system board with a first surface of the thermal dissipation device;
   dissipating heat from a surface area of the plural processors with a second surface of the thermal dissipation device;
   dissipating heat from the plural processors with (i) a direct heat exchange from the plural processors to the thermal dissipation device and (ii) an airflow generated by the thermal dissipation device onto the plural processors.

10. The method of claim 9 further comprising:
    dissipating heat from the power system board with (i) a direct heat exchange from the power system board to the thermal dissipation device and (ii) an airflow generated by the thermal dissipation device onto the power system board.

11. A method, comprising:
    connecting a memory and plural separate processors to a circuit board;
    connecting, to form a vertically stacked configuration, a power system board to the circuit board;
    providing a thermal dissipation device between the power system board and the circuit board;
    dissipating heat from a surface area of the power system board with a first surface of the thermal dissipation device;
    dissipating heat from a surface area of the plural processors with a second surface of the thermal dissipation device;
    connecting the power system board, the circuit board, and the thermal dissipation device together to form a rectangular shaped module;
    connecting the module to a system board;
    removing the module from the system board;
    replacing only the power system board; and
    re-connecting the module having the replaced power system board to the system board.

* * * * *